United States Patent
Weisfield et al.

(10) Patent No.: US 9,029,794 B2
(45) Date of Patent: May 12, 2015

(54) X-RAY MATRIX IMAGER BASED ON A MULTIPLE-GATE-LINE DRIVING SCHEME AND A SHARED-GATE-LINE DRIVING SCHEME

(71) Applicant: Varian Medical Systems, Inc., Palo Alto, CA (US)

(72) Inventors: Richard Weisfield, Los Altos, CA (US); Ivan P. Mollov, Mountain View, CA (US); Pieter Gerhard Roos, Sandy, UT (US)

(73) Assignee: Varian Medical Systems, Inc., Palo Alto, CA (US)

( * ) Notice: Subject to any disclaimer, the term of this patent is extended or adjusted under 35 U.S.C. 154(b) by 0 days.

(21) Appl. No.: 14/536,704

(22) Filed: Nov. 10, 2014

(65) Prior Publication Data

US 2015/0060682 A1    Mar. 5, 2015

Related U.S. Application Data

(63) Continuation-in-part of application No. 13/420,928, filed on Mar. 15, 2012, now Pat. No. 8,884,238.

(51) Int. Cl.
*G01T 1/24*    (2006.01)
*H01L 27/146*    (2006.01)

(52) U.S. Cl.
CPC .... *H01L 27/14658* (2013.01); *H01L 27/14641* (2013.01); *G01T 1/24* (2013.01)

(58) Field of Classification Search
USPC .......................... 250/370.01, 370.08, 370.09
See application file for complete search history.

(56) References Cited

U.S. PATENT DOCUMENTS

| | | | |
|---|---|---|---|
| 7,619,197 B2 | 11/2009 | Tredwell et al. | |
| 7,902,514 B2 | 3/2011 | Miyako et al. | |
| 2011/0303849 A1 | 12/2011 | Tredwell et al. | |
| 2013/0240745 A1 | 9/2013 | ROOS et al. | |

FOREIGN PATENT DOCUMENTS

WO    9742661 A1    11/1997

OTHER PUBLICATIONS

International Search Report and Written Opinion of the International Searching Authority, International application No. PCT/US13/31113, May 28, 2013.

*Primary Examiner* — Mark R Gaworecki
(74) *Attorney, Agent, or Firm* — SU IP Consulting

(57) ABSTRACT

An X-ray matrix imager is configured to operate based on a multiple-gate-line driving scheme and a shared-data-line driving scheme. The X-ray matrix imager includes a matrix with multiple pixels, multiple gate line sets, multiple data lines, multiple gate drivers, multiple row multiplexers, and multiple pull-down units. Each gate line sets includes a first gate line coupled to a first pixel and a second gate line coupled to a second pixel adjacent to the first pixel. Each data line is coupled to the multiple gate line sets for receiving charges accumulated on the pixels. Each row multiplexer is configured to selectively couple a corresponding gate driver to the first gate line or the second gate line in a corresponding gate line set. Each pull-down unit is configured to couple the first gate line to a constant voltage when the first gate line is not coupled to the corresponding gate driver.

26 Claims, 7 Drawing Sheets

US 9,029,794 B2

X-RAY MATRIX IMAGER BASED ON A MULTIPLE-GATE-LINE DRIVING SCHEME AND A SHARED-GATE-LINE DRIVING SCHEME

CROSS-REFERENCE TO RELATED APPLICATIONS

This application is a continuation-in-part of U.S. patent application Ser. No. 13/420,928, filed Mar. 15, 2012. The U.S. patent application Ser. No. 13/420,928, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

Various techniques have been developed for obtaining digital X-ray and gamma ray images of an object for purposes such as X-ray diagnostics, medical radiology, non-destructive testing, and so on. In one conventional approach, a flat-panel, two-dimensional, digital X-ray imager may include a plurality of detecting pixels formed on a silicon substrate. However, due to size restrictions of silicon wafers, multiple patched wafers are normally required for large-sized imagers. In another conventional approach, a matrix of detecting pixels may be formed on a single large glass substrate, instead of multiple silicon wafers. This approach requires the use of external circuits to drive and detect signals from the matrix of pixels. A high-resolution X-ray matrix imager requires small pixel pitches so that more connections to external driving circuits are required. It is however difficult to achieve pixel pitches that are smaller than 100 um on a glass substrate, due to the high density of connections, and such a bottleneck often limits the resolution of the matrix imager. Although row multiplexers may be used in a X-ray matrix imager in order to lower the number of gate drivers for a given resolution, this conventional gate multiplexing scheme causes unintended artifacts due to floating gate lines.

SUMMARY

In at least some embodiments of the present disclosure, a matrix imager includes a matrix, a plurality of gate line sets, a plurality of data lines, a gate driver, a row multiplexer, and a pull-down unit. The matrix includes a plurality of rows of pixels configured to accumulate charges in response to light or radiation. Each of the gate line sets includes a first gate line coupled to a first pixel among a first row of pixels of the matrix, and a second gate line coupled to a second pixel. Each of the data lines is arranged to be coupled to the plurality of gate line sets for receiving charges accumulated on the first row of pixels. The gate driver is configured to provide a select signal for turning on the first pixel and the second pixel. The row multiplexer is configured to selectively couple the gate driver to the first gate line or the second gate line. The pull-down unit is configured to couple the first gate line to a constant voltage when the first gate line is not coupled to the gate driver.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
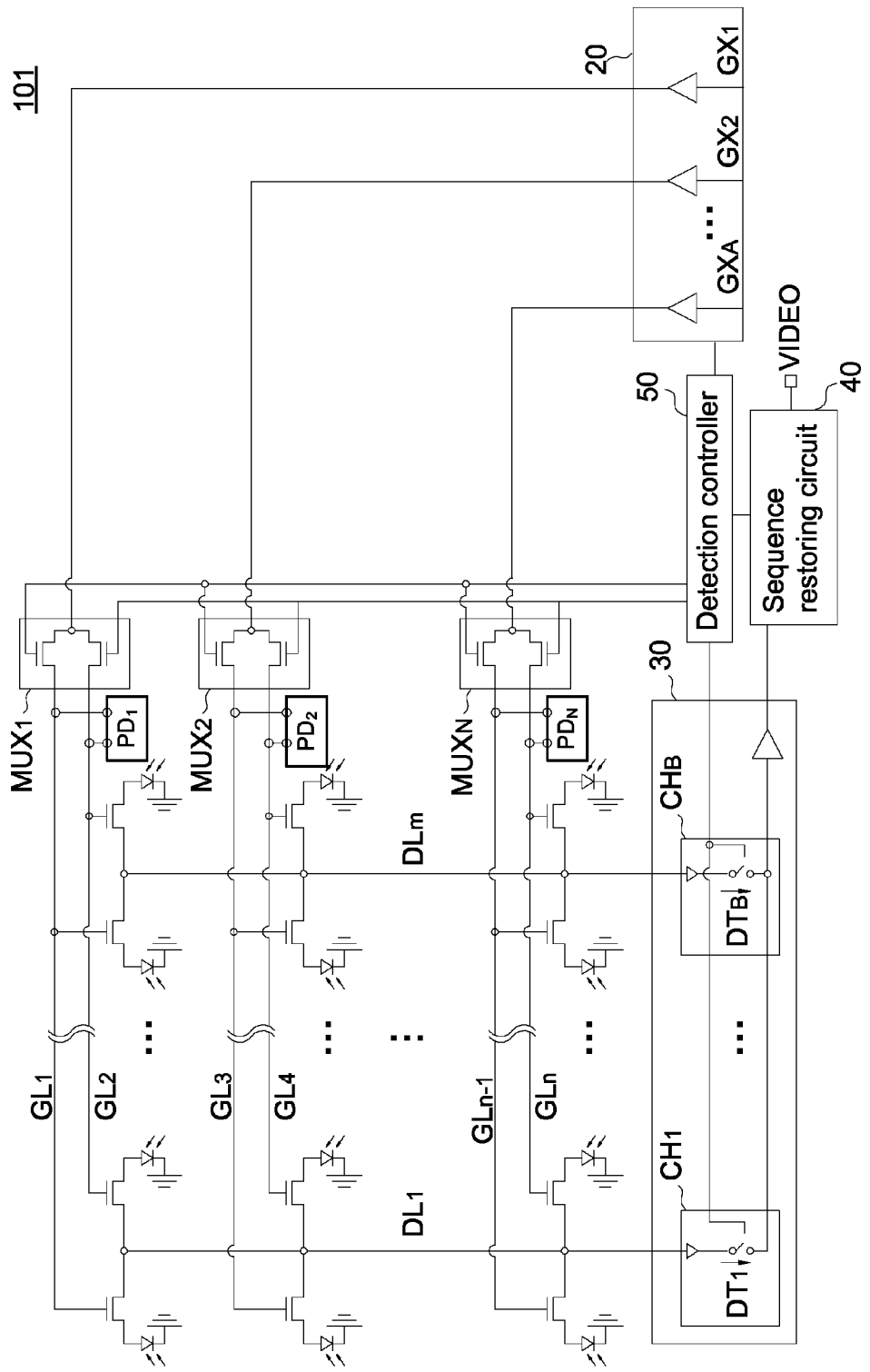
FIGS. 1, 2, 3, 4, and 5 are example matrix imagers configured to obtain X-ray images in accordance with at least some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein. The mirror image nature of the pixels in adjacent columns is an artifact of the drawing style and is not material to this disclosure. Pixels in adjacent columns may be identical or the layout may be tailored to ease design of the matrix.

FIGS. 1, 2, 3, 4, and 5 are example matrix imagers configured to obtain X-ray images in accordance with at least some embodiments of the present disclosure. Each of the matrix imagers 101, 102, 103, 104, and 105 may include a pixel matrix having M columns and N rows, a plurality of gate lines $GL_1$-$GL_n$, a plurality of data lines $DL_1$-$DL_m$, a plurality of row multiplexers $MUX_1$-$MUX_N$, a plurality of pull-down units $PD_1$-$PD_N$, a selecting circuit 20, a read-out circuit 30, a sequence restoring circuit 40, and a detection controller 50 (M is a positive even integer, and N, m, n are positive integers). The M by N pixel matrix may include a plurality of pixels configured to accumulate charges in response to light or radiation. In one embodiment, each pixel may include, but not limited to, a photodiode and a switch, such as a field-effect transistor (FET), thin-film transistor (TFT), or diode.

The selecting circuit 20 may include a plurality of gate drivers $GX_1$-$GX_A$ (A is a positive even integer) configured to generate select signals for turning on the switches in corresponding rows of pixels. Charges accumulated in each selected pixel may then be transferred to the read-out circuit 30 via a corresponding data line.

The read-out circuit 30 may include a plurality of charge amplifier channels $CH_1$-$CH_B$ (B is a positive integer) each coupled to one or more of the data lines $DL_1$-$DL_m$. Charges deposited on each data line may be collected, amplified and processed by a corresponding charge amplifier channel for generating corresponding electrical signals $DT_1$-$DT_B$.

The pixels, the gate lines, and the data lines of the matrix imagers 101, 102, 103, and 104 may be arranged in a shared data line structure. Each pair of two adjacent columns of pixels may be coupled to a communal data line on opposite sides (m=M/2). Each row of pixels may be coupled to a corresponding gate line set which includes two or more adjacent gate lines. Various embodiments illustrating the shared data line structure will be described in more details in subsequent paragraphs.

The pixels, the gate lines, and the data lines of the matrix imager 150 may be arranged in a non-shared data line structure. Each column of pixels may be coupled to a corresponding data line (m=M). Each row of pixels may be coupled to a corresponding gate line (n=N).

The detection controller 50 may be configured to control the operations of the selecting circuit 20, the read-out circuit 30, and/or the sequence restoring circuit 40. Since multiple pixels on the same row share a communal data line in the illustrative embodiments depicted in FIGS. 1, 2, 3 and 4, a driving scheme using multiple-gate-line selection may be utilized for transmitting accumulated charges of each pixel to the communal data line in a predetermined sequence. Since pixel data is no longer read out in a raster pattern which can be processed or displayed by conventional video equipment, the sequence restoring circuit 40 may be configured to store the electrical signals $DT_1$-$DT_B$ received from the read-out circuit 30 sequentially and output each stored electrical signal with a certain amount of delay, thereby generating a video signal VIDEO in a required raster pattern. The sequence restoration may alternatively be implemented in software, running on an external image processing computer. In the illustrative embodiment depicted in FIG. 5, the sequence restoring circuit 40 may be optional.

The N row multiplexers $MUX_1$-$MUX_N$ are coupled between the gate drivers $GX_1$-$GX_A$ and the gate line sets each including $2^Y$ adjacent gate lines. Each gate driver may be selectively coupled to one of the $2^Y$ gate lines in a corresponding gate line set via a corresponding row multiplexer, which may be controlled by the detection controller 50. For a given number of gate lines, the number of the required gate drivers in the selecting circuit 20 may be lowered using the row multiplexers $MUX_1$-$MUX_N$.

Figure 2:
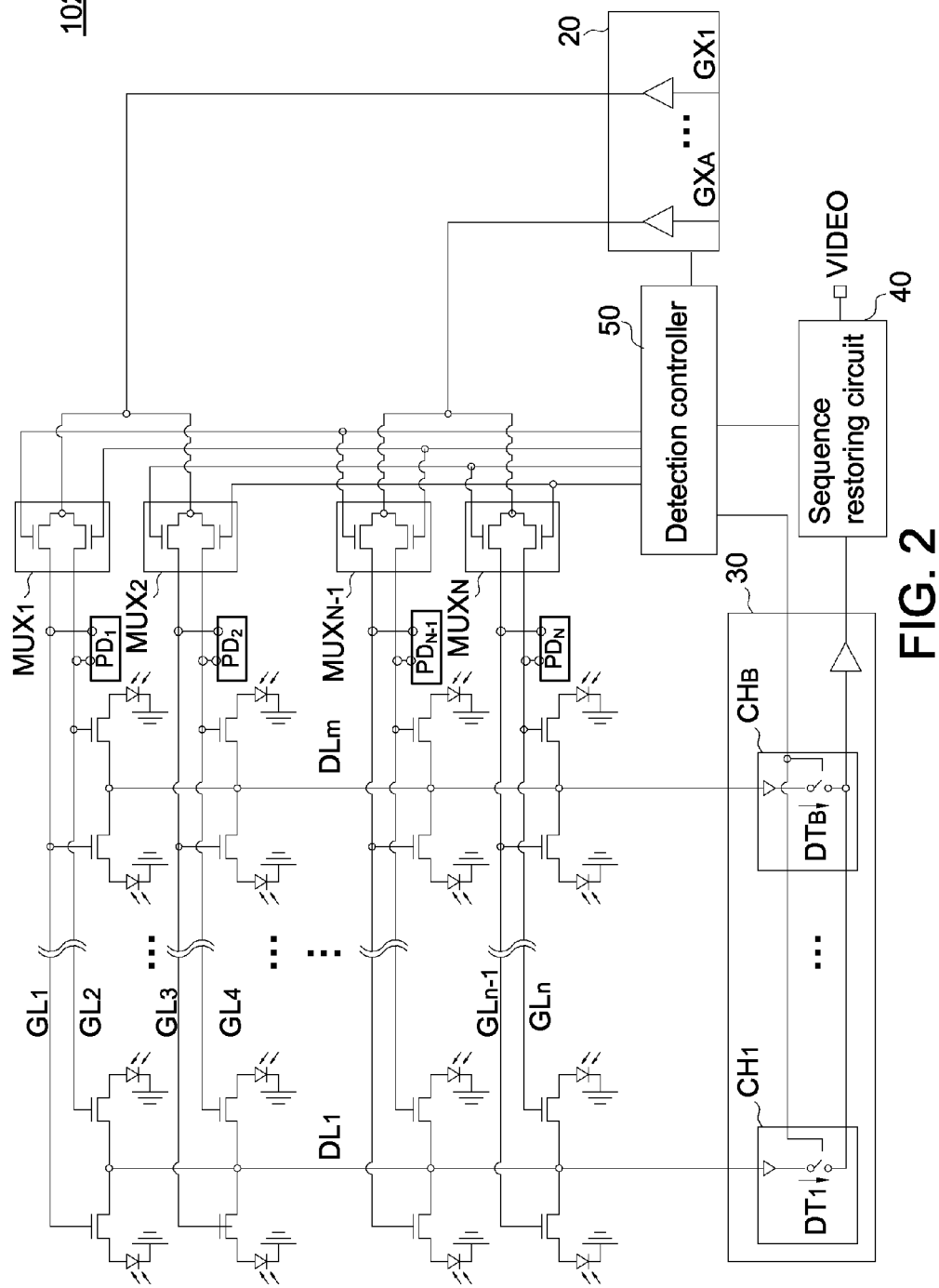

In the illustrative embodiments depicted in FIGS. 1 and 2, the matrix imagers 101 and 102 are configured to operate based on a single-sided multiple-gate-line driving scheme with X:1 row-multiplexing and a shared-data-line driving scheme with $2^Y$:1 column-multiplexing. The selecting circuit 20 of the matrix imagers 101 and 102 may include A gate drivers $GX_1$-$GX_A$ disposed on one side of the pixel matrix, wherein $A=n/X=(2^Y/X)*N$. The read-out circuit 30 of the matrix imagers 101 and 102 may include B charge amplifier channels $CH_1$-$CH_B$ coupled to Y adjacent data lines among the data lines $DL_1$-$DL_m$, wherein $B=M/2^Y$. The N row multiplexers $MUX_1$-$MUX_N$ are coupled between the gate drivers $GX_1$-$GX_A$ and the gate line sets each including $2^Y$ adjacent gate lines. Each gate driver may be selectively coupled to one of the $2^Y$ gate lines in a corresponding gate line set via a corresponding row multiplexer, which may be controlled by the detection controller 50.

FIG. 1 depicts a configuration when X=2 and Y=1 (i.e., 2:1 row-multiplexing and 2:1 column-multiplexing), in which each gate driver may be selectively coupled to one of two gate lines in a corresponding gate line set, and each charge amplifier channel may be coupled to a corresponding data line. When operating the M by N pixel matrix of the matrix imager 101, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 101 may be further reduced without increasing the number of the required gate drivers in the selecting circuit 20.

FIG. 2 depicts a configuration when X=4 and Y=1 (i.e., 4:1 row-multiplexing and 2:1 column-multiplexing), in which each gate driver may be selectively coupled to one of the four gate lines in two corresponding gate line sets, and each charge amplifier channel may be coupled to a corresponding data line. When operating the M by N pixel matrix of the matrix imager 102, the number of the required data lines and the required charge amplifier channels in the read-out circuit 30 may be lowered to M/2, and the number of the required gate lines may need to be increased to 2N. However, the number of the required gate drivers in the selecting circuit 20 may be lowered to N/2 using the row multiplexers. Therefore, the number of the required charge amplifier channels in the read-out circuit 30 of the matrix imager 102 may be further reduced without increasing the number of the required gate drivers in the selecting circuit 20.

Figure 3:
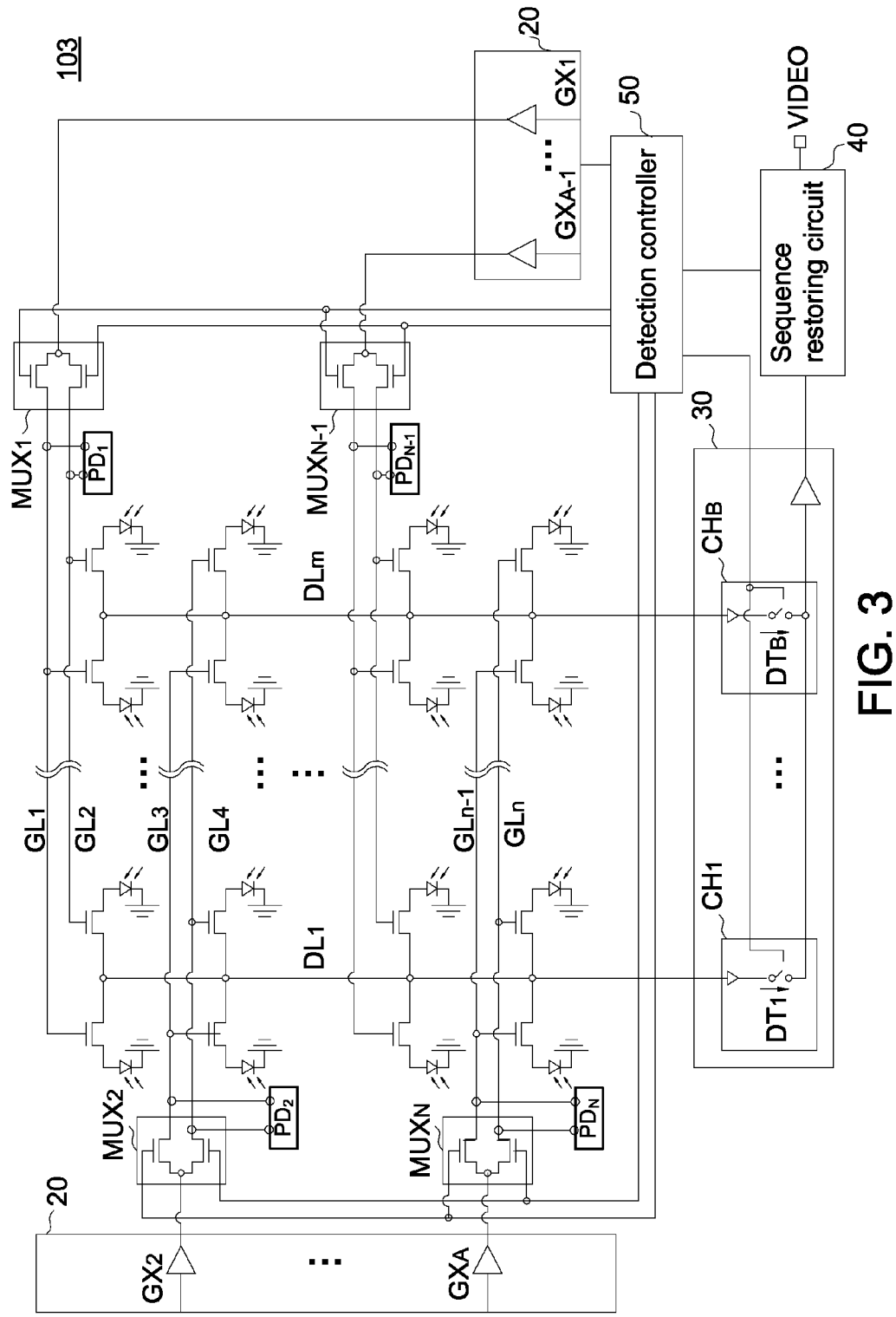
Figure 4:
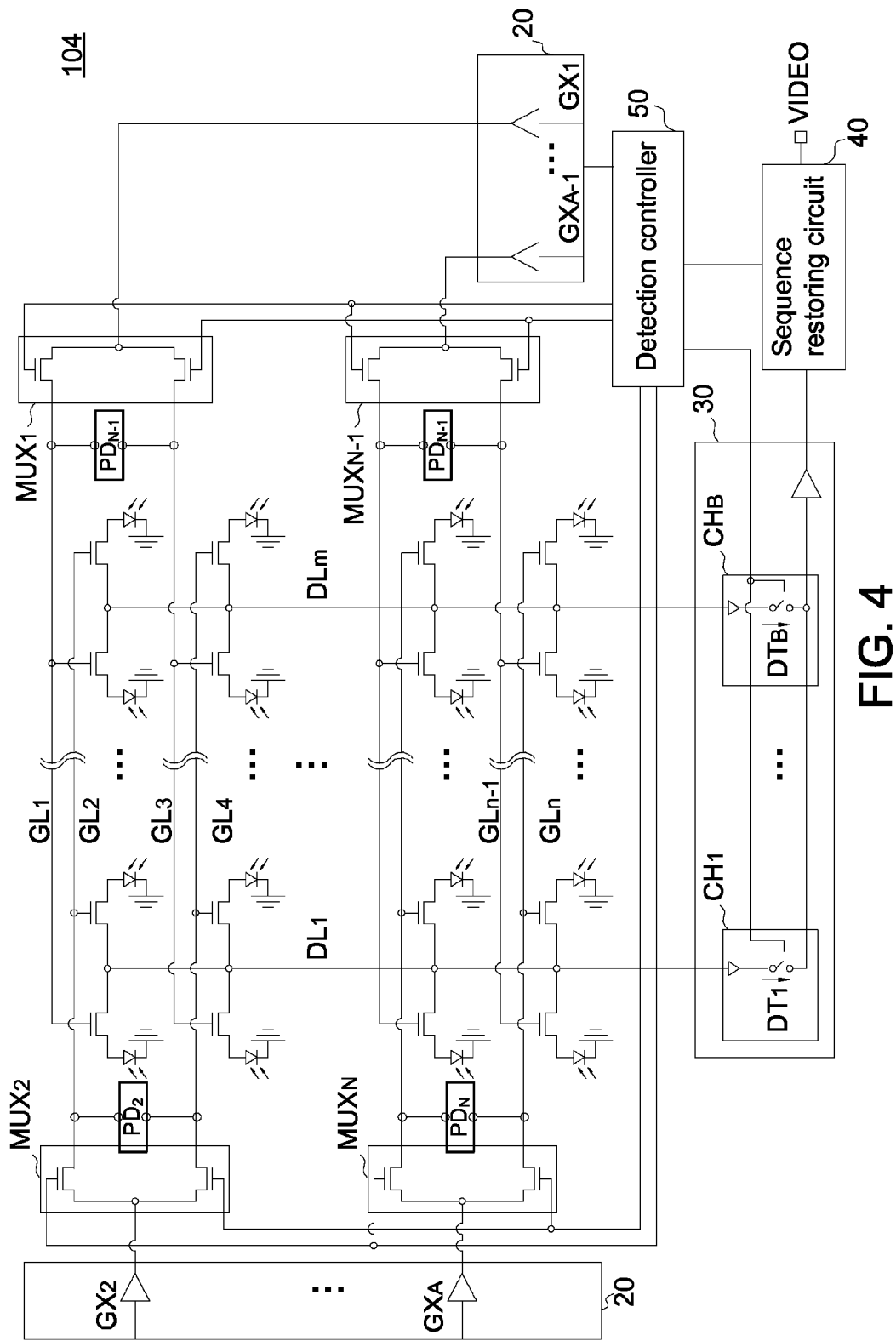

In the illustrative embodiments depicted in FIGS. 3 and 4, the matrix imagers 103 and 104 are configured to operate based on a dual-sided multiple-gate-line driving scheme with X:1 row-multiplexing and a shared-data-line driving scheme with $2^Y$:1 column-multiplexing. The selecting circuit 20 of the matrix imagers 103 and 104 may include A gate drivers $GX_1$-$GX_A$ disposed on opposite sides of the pixel matrix, wherein $A=n/X=(2^Y/X)*N$. The read-out circuit 30 of the matrix imagers 103 and 104 may include B charge amplifier channels $CH_1$-$CH_B$ coupled to Y adjacent data lines among the data lines $DL_1$-$DL_m$, wherein $B=M/2^Y$. The N row multiplexers $MUX_1$-$MUX_N$ are coupled between the gate drivers $GX_1$-$GX_A$ and the gate line sets each including $2^Y$ adjacent gate lines. Each gate driver may be selectively coupled to one of the $2^Y$ gate lines in one or more corresponding gate line sets via a corresponding row multiplexer, which may be controlled by the detection controller 50.

FIG. 3 depicts a configuration when X=2 and Y=1 (i.e., 2:1 row-multiplexing and 2:1 column-multiplexing), in which each gate driver may be selectively coupled to one of the two gate lines in a corresponding gate line set on a corresponding side of the pixel matrix, and each charge amplifier channel may be coupled to a corresponding data line. When operating the M by N pixel matrix of the matrix imager 103, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 103 may be further reduced without increasing the number of the required gate drivers in the selecting circuit 20. The matrix imager 103 may be configured to acquire image data close to one of the physical edges for mammographic imaging in a high-resolution imaging system.

FIG. 4 depicts a configuration when X=2 and Y=1 (i.e., 2:1 row-multiplexing and 2:1 column-multiplexing), in which each gate driver may be selectively coupled to one of the two gate lines in two corresponding gate line sets on a corresponding side of the pixel matrix, and each charge amplifier channel may be coupled to a corresponding data line. When operating the M by N pixel matrix of the matrix imager 104, the number of the required data lines and the required charge amplifier channels in the read-out circuit 30 may be lowered to M/2, and the number of the required gate lines may need to be increased to 2N. However, the number of the required gate drivers in the selecting circuit 20 may be equal to N using the row multiplexers. Therefore, the number of the required charge amplifier channels in the read-out circuit 30 of the matrix imager 104 may be further reduced without increasing the number of the required gate drivers in the selecting circuit 20. The matrix imager 104 may also be configured to acquire image data very close to one of the physical edges for mammographic imaging in a high-resolution imaging system.

Figure 5:
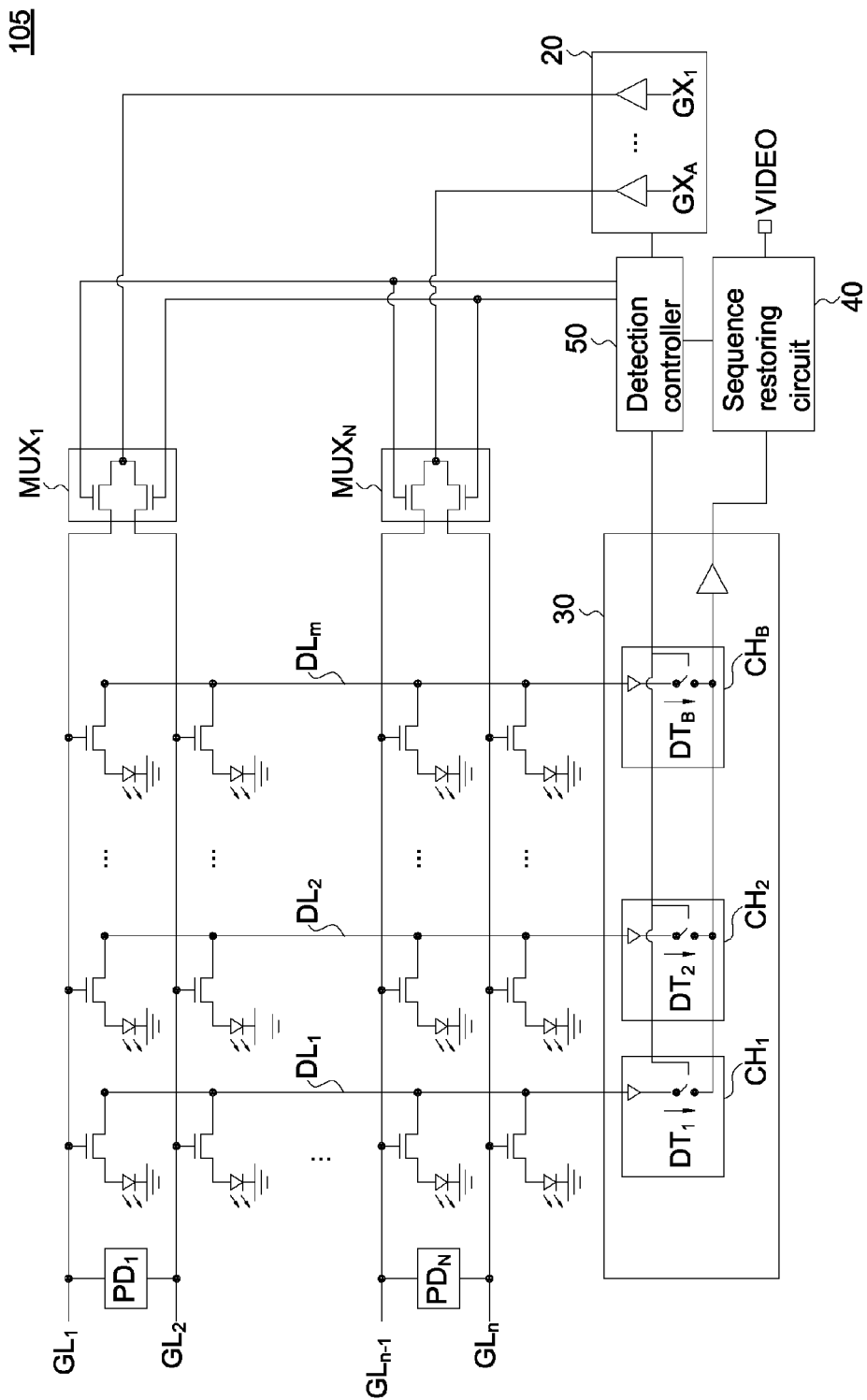

In the illustrative embodiments depicted in FIG. 5, the matrix imager 105 is configured to operate based on a single-sided multiple-gate-line driving scheme with 2:1 row-multiplexing and a non-shared-data-line driving scheme without any column-multiplexing. The selecting circuit 20 of the matrix imager 105 may include A gate drivers $GX_1$-$GX_A$ disposed on one side of the pixel matrix, wherein A=n/2. The read-out circuit 30 of the matrix imager 105 may include B charge amplifier channels $CH_1$-$CH_B$ coupled to the data lines $DL_1$-$DL_m$, respectively, wherein B=m. The N row multiplexers $MUX_1$-$MUX_N$ are coupled between the gate drivers $GX_1$-$GX_A$ and the gate line sets each including 2 adjacent gate lines. Each gate driver may be selectively coupled to one of the two gate lines in a corresponding gate line set via a corresponding row multiplexer, which may be controlled by the detection controller 50.

In the embodiments illustrated in FIGS. 1, 2, 3, 4, and 5, the introduction of the row multiplexers may render some gate lines floating. Unselected floating gate lines may cause unintended effects, such as, without limitation, pixel switching or crosstalk, between rows of pixels. The pull-down units $PD_1$-$PD_n$ in the imagers of FIGS. 1, 2, 3, 4, and 5 are included to address at least the issue of floating gate lines. In accordance with some embodiments of the present disclosure, each pull-down unit is arranged to keep a corresponding gate line at a constant voltage $V_{OFF}$, which does not turn on the pixels, when the corresponding gate line is not selected by a corresponding multiplexer. More specifically, using the imager 101 of FIG. 1 as an example, assume the row multiplexer $MUX_1$ connects the gate line $GL_1$ to the gate driver $GX_1$ and disconnects the gate line $GL_2$ from the gate driver $GX_1$ at a certain point of time. Under such circumstances, the pull-down unit $PD_1$ is configured to allow the selected gate line $GL_1$ to be actively driven by the gate driver $GX_1$ and keep the unselected gate line $GL_2$ at the constant voltage $V_{OFF}$ instead of being floating.

In the embodiments illustrated in FIGS. 1, 2, 3, and 4, the pull-down units $PD_1$-$PD_n$ and the row multiplexers $MUX_1$-$MUX_N$ are disposed on the same side of the pixel matrix. Alternatively, a corresponding pull-down unit and its corresponding row multiplexer may also be disposed on opposite sides of the pixel matrix.

In the embodiment illustrated in FIG. 5, the pull-down units $PD_1$-$PD_n$ and the row multiplexer $MUX_1$-$MUX_N$ are disposed on opposite sides of the pixel matrix Alternatively, a corresponding pull-down unit and its corresponding row multiplexer may also be disposed the same side of the pixel matrix.

Figure 6:
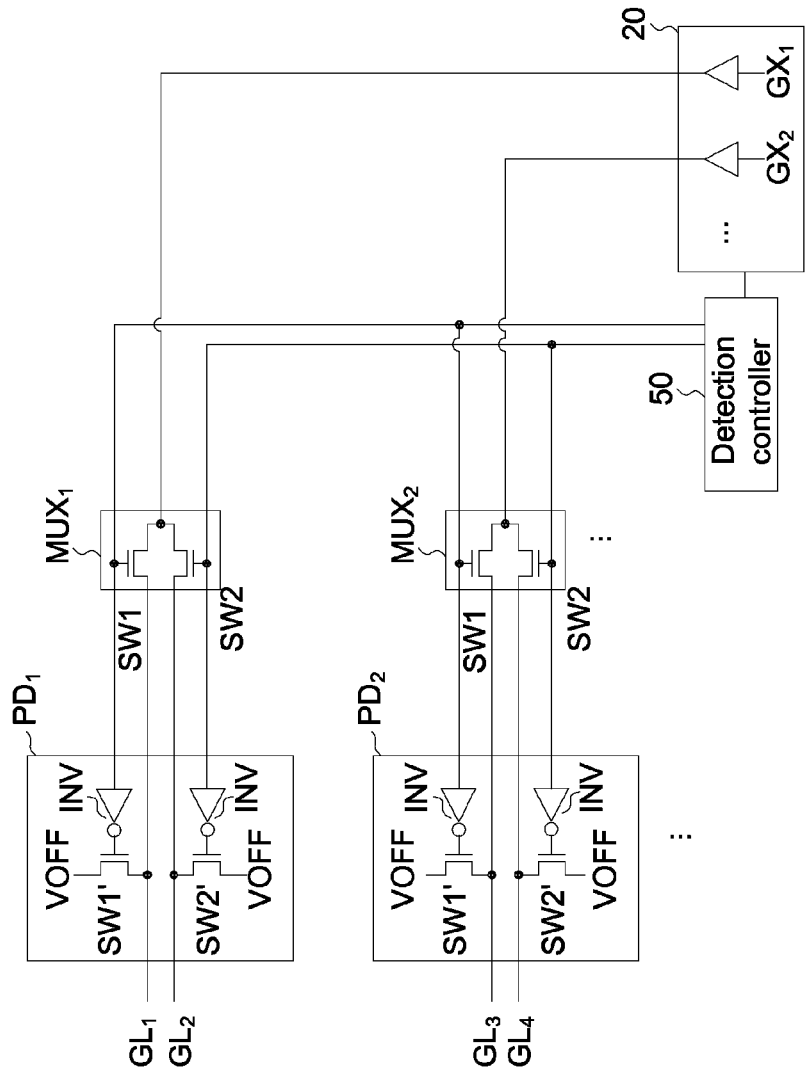
FIGS. 6 and 7 are example implementations of the pull-down units, the row multiplexers and the detection controller in a matrix imager configured to obtain X-ray images in accordance with at least some embodiments of the present disclosure.
Figure 7:
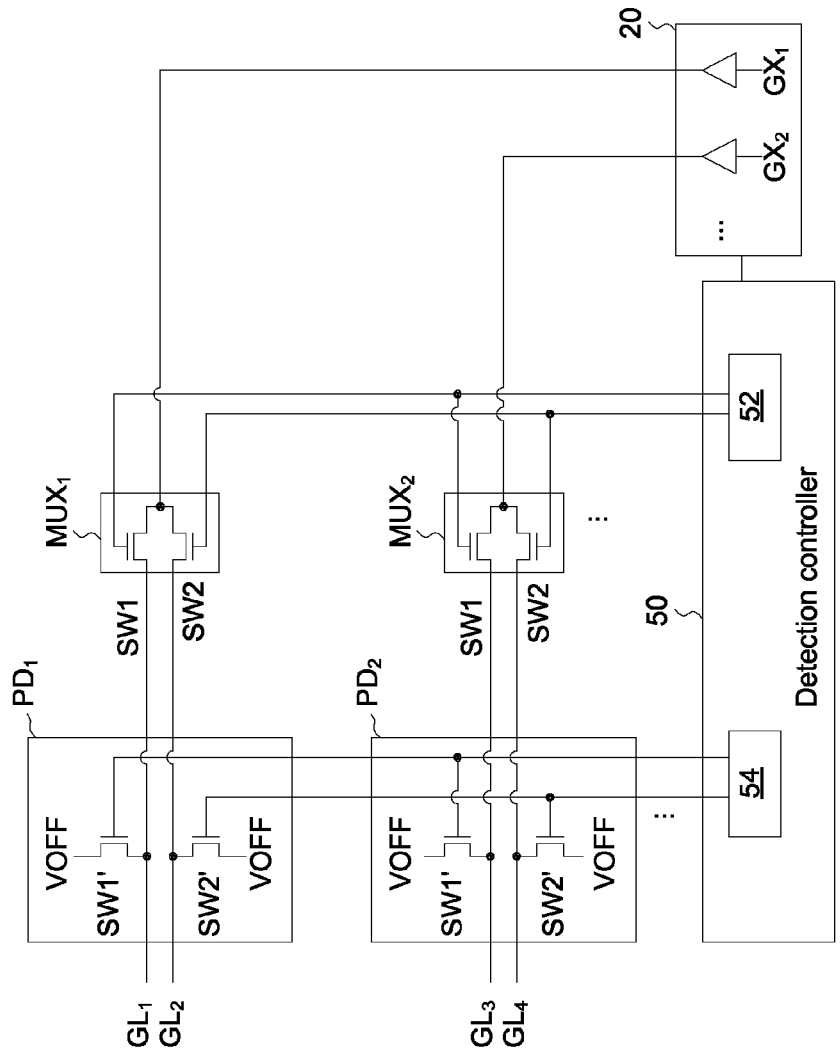

FIGS. 6 and 7 illustrate embodiments of the pull-down units, the row multiplexers and the detection controller in a matrix imager configured to obtain X-ray images in accordance with at least some embodiments of the present disclosure. Each of the row multiplexers $MUX_1$-$MUX_N$ may include two switches SW1-SW2. Each of the pull-down units $PD_1$-$PD_N$ may include two switches SW1'-SW2'. Each of the switches SW1-SW2 and SW1'-SW2' may be implemented using, but not limited to, one or multiple N-channel metal-oxide semiconductor (NMOS) TFTs, P-channel metal-oxide semiconductor (PMOS) TFTs, or complimentary metal-oxide semiconductor (CMOS) TFTs.

Each of the switches SW1-SW2 in the row multiplexers $MUX_1$-$MUX_N$ includes a first end 1 coupled to a corresponding gate driver, a second end 2 coupled to a corresponding gate line, and a control 3 coupled to receive a control signal from the detection controller 50. Each row multiplexer is configured to selectively couple one gate line to a corresponding gate driver based on the control signals supplied to the control ends 3 of the switches SW1-SW2.

Each of the switches SW1'-SW2' in the pull-down units $PD_1$-$PD_N$ includes a first end 1 coupled to receive the constant voltage $V_{OFF}$, a second end 2 coupled to a corresponding gate line, and a control 3 coupled to receive a control signal. Each pull-down unit is configured to selectively couple a corresponding gate line to the constant voltage $V_{OFF}$ based on the control signals supplied to the control ends 3 of the switches SW1'-SW2'.

In the embodiment illustrated in FIG. 6, the pull-down units $PD_1$-$PD_N$ may be driven by the corresponding row multiplexers $MUX_1$-$MUX_N$, which is driven by the detection controller 50. The control end 3 of the switch SW1' in each pull-down unit is coupled to the control end 3 of the switch SW1 in a corresponding row multiplexer via an inverter INV. The control end 3 of the switch SW2' in each pull-down unit is coupled to the control end 3 of the switch SW2 in a corresponding row multiplexer via an inverter INV. Therefore, the control signal supplied to the control end 3 of the switch SW1 in each row multiplexer and the control signal supplied to the control end 3 of the switch SW1' in each pull-down unit have opposite phases. Since only one of the switches SW1 and SW1' is turned on at the same time and only one of the switches SW2 and SW2' is turned on at the same time, a selected gate line may be actively driven by the gate driver $GX_1$ and one or more unselected gate lines may be kept at the constant voltage $V_{OFF}$ instead of being floating.

In the embodiment illustrated in FIG. 7, the pull-down units $PD_1$-$PD_N$ and the corresponding row multiplexers $MUX_1$-$MUX_N$ may be driven by separate driver chips in the detection controller 50. The driver chip 52 is configured to supply the control signals to the control ends 3 of the switches SW1-SW2 in each row multiplexer. The driver chip 54 is configured to supply the control signals to the control ends 3 of the switches SW1'-SW2' in each pull-down unit. The driver chips 52 and 54 are configured to operate in a manner so that only one of the switches SW1 and SW1' is turned on at the same time, and only one of the switches SW2 and SW2' is turned on at the same time. Therefore, a selected gate line may be actively driven by the gate driver $GX_1$ and one or more unselected gate lines may be kept at the constant voltage $V_{OFF}$ instead of being floating. When separate driver chips are used to drive the pull-down units $PD_1$-$PD_N$ and the corresponding row multiplexers $MUX_1$-$MUX_N$ that are disposed on the same side of the pixel matrix (as depicted in FIGS. 1, 2, 3, and 4), the driver chips 52 and 54 may be disposed on the same side of the read-out circuit 30. When separate driver chips are used to drive the pull-down units $PD_1$-$PD_N$ and the corresponding row multiplexers $MUX_1$-$MUX_N$ that are disposed on opposite sides of the pixel matrix (as depicted in FIG. 5), the driver chips 52 and 54 may be disposed on opposite sides of the read-out circuit 30.

In the illustrative embodiments depicted in FIGS. 1, 2, 3, 4, 5, 6, and 7, the selecting circuit 20, the read-out circuit 30, the sequence restoring circuit 40, and the detection controller 50 are disposed on the same side of the pixel matrix and may be controlled by a single electronic board, which will reduce manufacturing costs.

Although the configuration of 2:1 row-multiplexing and 2:1 column-multiplexing is depicted in FIGS. 1, 3, and 4 and the configuration of 4:1 row-multiplexing and 2:1 column-multiplexing is depicted in FIG. 2 for illustrative purposes, it will be recognized that a higher ratio in row-multiplexing or column-multiplexing may also be adopted in other embodiments. More specifically, a matrix imager in accordance with the present disclosure may be configured to operate based on a multiple-gate-line driving scheme with X:1 row-multiplexing and a shared-data-line driving scheme with $2^Y$:1 column-multiplexing, wherein X is an integer larger than 1 and Y is a positive integer. Also, a matrix imager in accordance with the present disclosure may be configured to operate based on a multiple-gate-line driving scheme with X:1 row-multiplexing and a non-shared-data-line driving scheme without any column-multiplexing, as depicted in FIG. 5.

Although the present disclosure has been described with reference to specific exemplary embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

We claim:
1. A matrix imager, comprising:
a matrix having a plurality of rows of pixels configured to accumulate charges in response to light or radiation;
a plurality of gate line sets, each gate line set including:
    a first gate line coupled to a first pixel among a first row of pixels of the matrix, and
    a second gate line coupled to a second pixel;
a plurality of data lines, each arranged to be coupled to both the first pixel and the second pixel for receiving charges accumulated on the first pixel and the second pixel;
a first gate driver configured to provide a first select signal for turning on the first pixel and the second pixel;
a first row multiplexer configured to selectively couple the first gate driver to the first gate line or the second gate line; and
a first pull-down unit configured to couple the first gate line to a constant voltage when the first gate line is not coupled to the first gate driver.

2. The matrix imager of claim 1, wherein:
the first pixel is coupled to a first data line among the plurality of data lines on a first side of the first data line; and
the second pixel is disposed on the first row of pixels of the matrix and coupled to the first data line on a second side of the first data line opposite to the first side of the first data line.

3. The matrix imager of claim 2, wherein:
the first gate line is further coupled to a third pixel among the first row of pixels of the matrix; and
the second gate line is further coupled to a fourth pixel among the first row of pixels of the matrix, wherein the third pixel is coupled to a second data line among the plurality of data lines on a first side of the second data line, the fourth pixel is coupled to the second data line on a second side of the second data line opposite to the first side of the second data line, and the first data line is adjacent to the second data line.

4. The matrix imager of claim 3, further comprising:
a read-out circuit configured to receive the charges accumulated in the first row of pixels and generate a plurality of electrical signals accordingly;
a sequence restoring circuit configured to arrange the plurality of electrical signals in a predetermined raster pattern; and a detection controller configured to control operations of the first gate driver, the first row multiplexer, and the sequence restoring circuit.

5. The matrix imager of claim 4, wherein:
the first gate driver, the read-out circuit, the sequence restoring circuit, the detection controller are disposed on a same side of the matrix.

6. The matrix imager of claim 2, further comprising:
a second gate line set comprising:
    a third gate line coupled to a third pixel among a second row of pixels of the matrix;
    a fourth gate line coupled to a fourth pixel among the second row of pixels of the matrix;
a second row multiplexer configured to selectively couple the first gate driver to the third gate line or the fourth gate line;
a second pull-down unit configured to couple the third gate line to the constant voltage when the third gate line is not coupled to the first gate driver, wherein:
    the first gate driver is further configured to provide the first select signal for turning on the third pixel and the fourth pixel;
    the third pixel is coupled to the first data line on the first side of the first data line; and
    the fourth pixel is coupled to the first data line on the second side of the first data line.

7. The matrix imager of claim 6, further comprising:
a read-out circuit configured to receive the charges accumulated in the first and second rows of pixels and generate a plurality of electrical signals accordingly;
a sequence restoring circuit configured to arrange the plurality of electrical signals in a predetermined raster pattern; and
a detection controller configured to control operations of the first gate driver, the first row multiplexer, the second row multiplexer and the sequence restoring circuit.

8. The matrix imager of claim 7, wherein:
the first gate driver, the read-out circuit, the sequence restoring circuit, the detection controller are disposed on a same side of the matrix.

9. The matrix imager of claim 6, wherein:
the first row multiplexer and the second row multiplexer are disposed on a first side of the matrix; and
the first pull-down unit and the second pull-down unit are disposed on a second side of the matrix opposite to the first side of the matrix.

10. The matrix imager of claim 2, further comprising:
a second gate line set comprising:
    a third gate line coupled to a third pixel among a second row of pixels of the matrix;
    a fourth gate line coupled to a fourth pixel among the second row of pixels of the matrix, wherein the third pixel is adjacent to the fourth pixel;
a second gate driver configured to provide a second select signal for turning on the third pixel and the fourth pixel;
a second row multiplexer configured to selectively couple the second gate driver to the third gate line or the fourth gate line; and
a second pull-down unit configured to couple the third gate line to the constant voltage when the third gate line is not coupled to the second gate driver, wherein the third pixel is coupled to the first data line on the first side of the first data line and the fourth pixel are coupled to the first data line on the second side of the first data line.

11. The matrix imager of claim 10, wherein the first and second row multiplexers are arranged on opposite sides of the matrix.

12. The matrix imager of claim 10, wherein:
the first row multiplexer and the first pull-down unit are disposed on opposite sides of the matrix; and
the second row multiplexer and the second pull-down unit are disposed on opposite sides of the matrix.

13. The matrix imager of claim 10, further comprising:
a read-out circuit configured to receive the charges accumulated in the first and second rows of pixels and generate a plurality of electrical signals accordingly;
a sequence restoring circuit configured to arrange the plurality of electrical signals in a predetermined raster pattern; and
a detection controller configured to control operations of the first gate driver, the second gate driver, the first row multiplexer, the second row multiplexer and the sequence restoring circuit.

14. The matrix imager of claim 13, wherein:
the first gate driver, the second gate driver, the read-out circuit, the sequence restoring circuit, the detection controller are disposed on a same side of the matrix.

15. The matrix imager of claim 1, wherein the first row multiplexer and the first pull-down unit are disposed on opposite sides of the matrix.

16. The matrix imager of claim 1, further comprising:
a second gate line set comprising:
a third gate line coupled to a third pixel among the first row of pixels of the matrix;
a fourth gate line coupled to a fourth pixel among a second row of pixels of the matrix;
a second gate driver configured to provide a second select signal for turning on the third pixel and the fourth pixel;
a second row multiplexer configured to selectively couple the second gate driver to the third gate line or the fourth gate line;
a second pull-down unit configured to couple the third gate line to the constant voltage when the third gate line is not coupled to the second gate driver, wherein:
the first pixel is coupled to the first data line on a first side of the first data line;
the second pixel is disposed on a second row of pixels of the matrix and coupled to the first data line a second side of the first data line opposite to the first side of the first data line;
the third pixel is coupled to the first data line on the second side of the first data line; and
the fourth pixel is coupled to the first data line on the second side of the first data line.

17. The matrix imager of claim 16, wherein the first and second row multiplexers are arranged on opposite sides of the matrix.

18. The matrix imager of claim 17, wherein:
the first row multiplexer and the first pull-down unit are disposed on opposite sides of the matrix; and
the second row multiplexer and the second pull-down unit are disposed on opposite sides of the matrix.

19. The matrix imager of claim 16, further comprising:
a read-out circuit configured to receive the charges accumulated in the first and second rows of pixels and generate a plurality of electrical signals accordingly;
a sequence restoring circuit configured to arrange the plurality of electrical signals in a predetermined raster pattern; and
a detection controller configured to control operations of the first gate driver, the second gate driver, the first row multiplexer, the second row multiplexer and the sequence restoring circuit.

20. The matrix imager of claim 19, wherein:
the first gate driver, the second gate driver, the read-out circuit, the sequence restoring circuit, the detection controller are disposed on a same side of the matrix.

21. The matrix imager of claim 1, wherein:
each row of pixels in the matrix is coupled to a corresponding data line among the plurality of data lines.

22. The matrix imager of claim 21, wherein the first row multiplexer and the first pull-down unit are disposed on opposite sides of the matrix.

23. The matrix imager of claim 1, wherein:
the first row multiplexer comprises:
a first switch including:
a first end coupled to the first gate driver;
a second end coupled to the first gate line; and
a control end coupled to receive a first control signal; and
a second switch including:
a first end coupled to the first gate driver;
a second end coupled to the second gate line; and
a control end coupled to receive a second control signal;
the first pull-down unit comprises:
a third switch including:
a first end coupled to a constant voltage;
a second end coupled to the first gate line; and
a control end coupled to receive a third control signal having a phase opposite to a phase of the first control signal; and
a second switch including:
a first end coupled to the constant voltage;
a second end coupled to the second gate line; and
a control end coupled to receive a fourth control signal having a phase opposite to a phase of the second control signal.

24. The matrix imager of claim 23, further comprising:
a first inverter coupled between the control end of the first switch and the control end of the third switch; and
a second inverter coupled between the control end of the second switch and the control end of the fourth switch.

25. The matrix imager of claim 23, further comprising:
a detection controller configured to control operations of the first gate driver, the first row multiplexer and the first pull-down unit, the detection controller including:
a first driver chip configured to supply the first control signal and the second control signal; and
a second driver chip configured to supply the third control signal and the fourth control signal.

26. The matrix imager of claim 25, further comprising:
a read-out circuit configured to receive the charges accumulated in the first row of pixels and generate a plurality of electrical signals accordingly, wherein the first driver chip and the second driver chip are disposed on opposite sides of the read-out circuit.

* * * * *